US011304317B2

(12) United States Patent  
Cavallaro et al.

(10) Patent No.: US 11,304,317 B2  
(45) Date of Patent: Apr. 12, 2022

(54) UNITARY PRE-FORMED FASCIA SPANNING AT LEAST TWO SIDES OF AN ELECTRONIC DEVICE HOUSING AND CORRESPONDING METHODS AND DEVICES

(71) Applicant: Motorola Mobility LLC, Chicago, IL (US)

(72) Inventors: Alberto R. Cavallaro, Northbrook, IL (US); William Groves, Naperville, IL (US); Steve Emmert, McHenry, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 16/906,952

(22) Filed: Jun. 19, 2020

(65) Prior Publication Data

US 2021/0400822 A1 Dec. 23, 2021

(51) Int. Cl.  
*H05K 5/00* (2006.01)  
*H05K 1/02* (2006.01)  
(Continued)

(52) U.S. Cl.  
CPC ......... *H05K 5/0017* (2013.01); *G06F 1/1637* (2013.01); *G06F 3/0412* (2013.01); *H05K 1/028* (2013.01)

(58) Field of Classification Search  
CPC ...... G06F 1/1626; G06F 1/163; G06F 1/1637; G06F 1/1643; G06F 1/1652; G06F 1/1656; G06F 1/1686; G06F 1/1688; G06F 1/1694; G06F 3/017; G06F 3/0416; G06F 3/0481; G06F 3/04817; G06F 3/04883; G06F 3/04886; G06F 2200/1614; G06F 2203/04102; H04R 1/028; H04R 1/403; H04R 1/406; H04R 3/005; H04R 3/12; H04R 2420/03; H04R 2499/11; G04G 17/08; G04G 21/08; H04B 1/3827;  
(Continued)

(56) References Cited

U.S. PATENT DOCUMENTS 11,150,862 B2 * 10/2021 Cui .................. H01L 51/0097  
2012/0106078 A1 * 5/2012 Probst ............... G06F 1/1654  
361/679.56  
(Continued)

OTHER PUBLICATIONS

"Mi Mix Alpha", Unknown publication date but believed to be prior to filing of present application; viewed online Jul. 13, 2020 at mi.com.  
(Continued)

*Primary Examiner* — Nelson M Rosario  
(74) *Attorney, Agent, or Firm* — Philip H. Burrus, IV

(57) ABSTRACT

An electronic device has a device housing and a unitary pre-formed fascia coupled to, and wrapping around at least two sides of, the device housing. The electronic device can be manufactured by loading a unitary glass fascia to cause at least two surfaces of the unitary glass fascia to separate, positioning a device housing within the unitary glass fascia while the unitary glass fascia is loaded, and unloading the unitary glass fascia to cause the at least two surfaces of the unitary glass fascia to narrow, thereby causing the unitary glass fascia to span at least two sides of the device housing.

20 Claims, 8 Drawing Sheets

(51) Int. Cl.
*G06F 1/16* (2006.01)
*G06F 3/041* (2006.01)

(58) Field of Classification Search
CPC .............. H04B 1/3883; H04B 1/3888; H04M 1/0262; H04M 1/0283
See application file for complete search history.

(56) References Cited

U.S. PATENT DOCUMENTS

2013/0188366 A1* 7/2013 Russell-Clarke .... H05K 5/0017
362/362
2020/0057525 A1* 2/2020 Prest ..................... G06F 1/1686

OTHER PUBLICATIONS

"Schott Product Design", Future Innovation—Bendable/Foldable cover; Unknown publication date viewed online Jun. 20, 2020 at https://www.us.schott.com/innovation/ultrathinglass/.
"Xiaomi Mi Mix Alpha", Up Close Picture provided by inventor; Unknown publication date but prior to filing of present application.
Horwitz, Jeremy , "Royole show Mirage smart speaker with wrap-around OLED screen and Alexa", VentureBeat; Published Jan. 6, 2020; Viewed online Jul. 13, 2020 at https://venturebeat.com/2020/01/06/royole-shows-mirage-smart-speaker-with-wraparound-oled-screen-and-alexa/.

* cited by examiner

UNITARY PRE-FORMED FASCIA SPANNING AT LEAST TWO SIDES OF AN ELECTRONIC DEVICE HOUSING AND CORRESPONDING METHODS AND DEVICES

BACKGROUND

Technical Field

This disclosure relates generally to electronic devices, and more particularly to electronic devices with displays.

Background Art

Portable electronic device usage has become ubiquitous. Vast majorities of the population carry a smartphone, tablet computer, or laptop computer daily to communicate with others, stay in formed, to consume entertainment, and to manage their lives.

As the technology incorporated into these portable electronic devices has become more advanced, so to has their feature set. Illustrating by example, while early generation portable electronic devices included physical keypads, most modern portable electronic devices include touch-sensitive displays. To accommodate the increasing feature set, the display-to-device housing ratio is increasing, with displays becoming larger while device housings get smaller or stay the same size. It would be advantageous to have an improved device and manufacturing methods that allow this ratio to increase further.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present disclosure.

Figure 1:
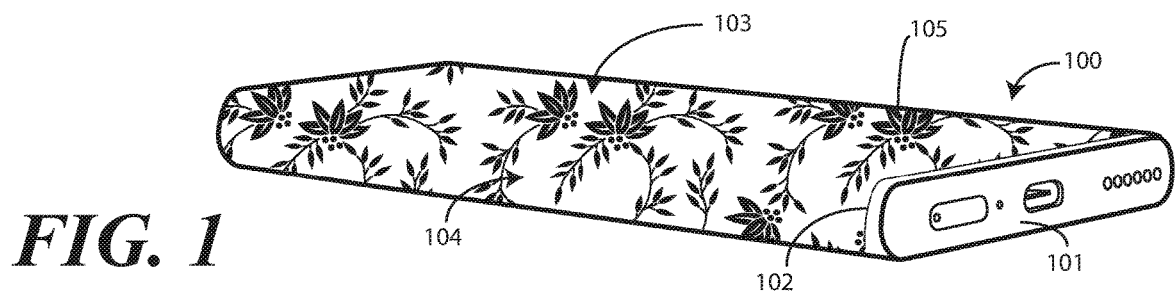
FIG. 1 illustrates one explanatory electronic device in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to manufacture of a unitary pre-formed glass fascia coupled to a device housing and wrapping around at least two sides thereof. Alternate implementations are included, and it will be clear that functions may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, it is expected that one of ordinary skill, notwithstanding possibly significant effort and many design choices motivated by, for example, available time, current technology, and economic considerations, when guided by the concepts and principles disclosed herein will be readily capable of generating such unitary pre-formed glass fasciae with minimal experimentation.

Embodiments of the disclosure do not recite the implementation of any commonplace business method aimed at processing business information, nor do they apply a known business process to the particular technological environment of the Internet. Moreover, embodiments of the disclosure do not create or alter contractual relations using generic computer functions and conventional network operations. Quite to the contrary, embodiments of the disclosure employ methods that, when applied to electronic device and/or user interface technology, improve the functioning of the electronic device itself by and improving the overall user experience to overcome problems specifically arising in the realm of the technology associated with electronic device user interaction.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

As used herein, components may be "operatively coupled" when information can be sent between such components, even though there may be one or more intermediate or intervening components between, or along the connection path. The terms "substantially", "essentially", "approximately", "about" or any other version thereof, are defined as being close to as understood by one of ordinary skill in the art, and in one non-limiting embodiment the term is defined to be within ten percent, in another embodiment within five percent, in another embodiment within 1 percent and in another embodiment within one-half percent. The term "coupled" as used herein is defined as connected, although not necessarily directly and not necessarily mechanically. Also, reference designators shown herein in parenthesis indicate components shown in a figure other than the one in discussion. For example, talking about a device (10) while discussing figure A would refer to an element, 10, shown in figure other than figure A.

Embodiments of the disclosure contemplate that electronic devices are evolving to have displays on more than just the major surfaces. For example, while conventional electronic devices frequently include a display positioned solely on a single major surface of the device housing, embodiments of the disclosure contemplate that electronic devices will soon include displays on the first major surface and second major surface as well. Embodiments of the disclosure contemplate that some designers will desire displays on the minor surfaces as well.

Embodiments of the disclosure advantageously provide a "wrapped" display comprising a unitary pre-formed glass fascia that is coupled to a device housing while wrapping around at least two sides of the device housing. The use of the wrapped display eliminates seams, lines, or other mechanical features between, for example, display surfaces positioned on minor surfaces of the electronic device and display surfaces positioned on the major surfaces of the electronic device. The use of a wrapped display provides a waterfall effect around the device housing with a continuous display surface so that content and other information can be presented without interruption. Embodiments of the disclosure allow for very aggressive radii of the curvatures, thereby allowing tightly wrapped display contours to be integrated into an electronic device. Embodiments of the disclosure provide a stack-up geometry and method for integration that can achieve full wrap around display solutions. Embodiments of the disclosure advantageously enable new user experiences and designs. Moreover, the unitary pre-formed glass fascia layers employed by embodiments of the disclosure maintain an approximate thickness that can withstand general use and abuse without damage.

In one or more embodiments, a unitary pre-formed glass fascia is formed into a U-shaped, ovular, partially ovular, stadium, partially stadium, discorectangle, partially discorectangle, obround, partially obround, sausage body, or partially sausage body shape (in cross section) and is then chemically strengthened. In one or more embodiments, this shape, when unconstrained and without loading from external forces, is configured to be the final curved shape the fascia will have when coupled to the electronic device.

In one or more embodiments, the unitary pre-formed glass fascia is then bent by loading forces to deflect and open the major faces of the predefined shape. In one or more embodiments, a flexible plastic display can then be laminated to the interior surfaces of the unitary pre-formed glass fascia. Additionally, a device housing can be positioned within the interior of the opened unitary pre-formed glass fascia. The loading forces can then be removed, thereby unloading the unitary pre-formed glass fascia to cause at least two surfaces of the unitary pre-formed glass to narrow, thereby causing the unitary pre-formed glass fascia to span at least two sides of the device housing.

In one or more embodiments, a chemically treated, unitary glass fascia having a thickness of about half a millimeter is loaded to cause at least two surfaces of the unitary glass fascia to separate. This causes the unitary glass fascia to deform, thereby creating an open state to receive a flexible display, which can be laminated to an interior surface of the unitary glass fascia. In one embodiment, where the unitary glass fascia is preformed into a partially obround shape, the loading moving the two open edges outward. However, in one or more embodiments the loading forces moving the two open edges outward are applied such that the glass of the unitary glass fascia is placed under a strain of less than one percent, which is within limits of chemically strengthened (undamaged) glass. A flexible display can then be laminated to the unitary glass fascia while the unitary glass fascia is loaded.

In one or more embodiments, a device housing can be positioned within the unitary glass fascia while loaded. Once the flexible display laminated and/or the device housing is positioned, the unitary glass fascia can be unloaded (released into its nominal state) by removing the loading forces. In one or more embodiments, this causes the at least two surfaces of the unitary glass fascia to narrow, thereby causing the unitary glass fascia to span at least two sides of the device housing. In one or more embodiments, the same fixture for deforming the glass during the laminating process can also be used to open up the unitary glass fascia for device housing insertion and positioning.

In one or more embodiments, a U-shaped or other-shaped glass fascia is initially formed so as to take on a predefined shape when in an unloaded state. Once formed, the glass fascia is chemically strengthened. Loading forces are applied to open the glass fascia, where a flexible plastic display can be laminated to the inner surface of glass. The glass fascia can then be unloaded, thereby wrapping a display assembly about the device housing contours.

Turning now to FIG. 1, illustrated therein is one explanatory electronic device 100 configured in accordance with one or more embodiments of the disclosure. As shown in FIG. 1, the electronic device 100 includes a device housing 101 and a pre-formed display assembly 102. The pre-formed display assembly 102 is coupled to, and wraps around at least two sides 103,104 of the device housing 101. The pre-formed display assembly 102 is unique in that it is a unitary display with contours that span and wrap about at least one minor surface, e.g., side 104, while also spanning at least one major surface, e.g., side 103. This is in contrast to prior art display designs that include segmented display portions where a first display is positioned on a major surface, a second display is placed on a second major or minor surface, and so forth. The electronic device 100 of FIG. 1 includes a pre-formed display assembly 102 that is continuous, unitary, and unbroken as it passes, for example, from side 103 to side 104.

Advantageously, the pre-formed display assembly 102 provides a desirable feature for electronic devices such as smartphones, tablet computers, laptop computers, and the like. In contrast to prior art electronic devices that have multiple displays with many elements, the electronic device 100 of FIG. 1, with its pre-formed display assembly 102, allows for, in one or more embodiments, the device housing 101 to be fully wrapped by the unitary, continuous, pre-formed display assembly 102. This pre-formed display assembly 102 can be referred to as a "waterfall" display because imagery 105 presented on the pre-formed display assembly 102 spill from the major surfaces of the pre-formed display assembly 102 spanning the major surfaces of the device housing 101 to the curved contours of the pre-formed display assembly 102 spanning the minor surfaces of the device housing 101, thereby cascading about the device housing 101 like water going over a waterfall.

As will be described in more detail below with reference to FIG. 3, in one or more embodiments the pre-formed display assembly 102 includes a unitary pre-formed fascia defining an outer surface of the pre-formed display assembly 102. The unitary pre-formed fascia, which may be manufactured from many materials including thermoplastics, resins, and polymers, is manufactured from chemically treated glass in one or more embodiments. Where manufactured from glass, the glass is initially formed such that the contours of its interior surface correspond to the contours of the exterior surfaces of the device housing 101 that the pre-formed display assembly 102 will enclose. Chemical treatments are then applied to strengthen the unitary pre-formed fascia.

Once strengthened, embodiments of the disclosure bend the glass using applied forces and stationary bosses to deform at least one major surface of the unitary pre-formed fascia, thereby causing at least two surfaces of the unitary pre-formed fascia to separate. A flexible plastic display can then be coupled to the interior surfaces of the unitary pre-formed fascia. The device housing 101 can also be positioned within the deformed unitary pre-formed fascia as well. The deformed unitary pre-formed fascia can then be unloaded to cause the surfaces of the unitary pre-formed fascia to narrow, thereby allowing the pre-formed display assembly 102 to envelop the device housing 101 by spanning at least two sides of the device housing 101.

Figure 2:
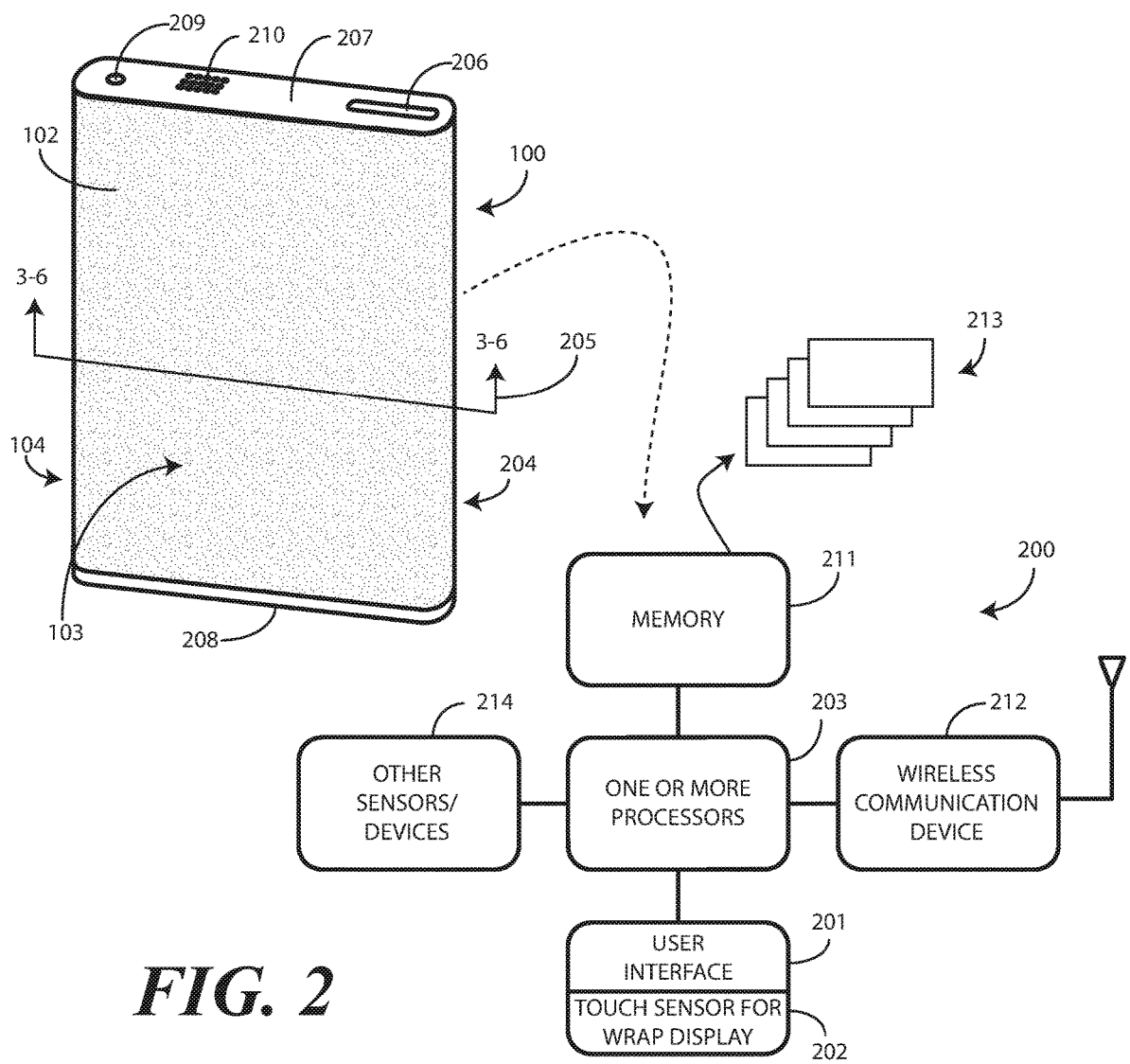
FIG. 2 illustrates an explanatory block diagram schematic for one electronic device configured in accordance with one or more embodiments of the disclosure.

Turning now to FIG. 2, illustrated therein the explanatory electronic device 100 of FIG. 1. As shown, the electronic device 100 includes the device housing 101 and the pre-formed display assembly 102. By comparing FIGS. 1 and 2, it can be seen that the pre-formed display assembly 102 spans at least three major faces of the device housing 101. These include a first major surface of the device housing 101, i.e., side 103, a first minor face of the device housing 101, i.e., side 104, and a second minor face of the device housing 101, i.e., side 204. As will be seen in FIG. 3 where the cross section 205 of the pre-formed display assembly 102 is shown, the pre-formed display assembly 102 also spans most of the major face separated from side 103 by side 104 and side 204 as well. As will be shown in FIG. 6 below, in other embodiments the pre-formed display assembly 102 can completely span four sides of the device housing 101 by spanning two major faces and two minor faces of the device housing 101.

It should be noted that while the pre-formed display assembly 102 spans the device housing 101 horizontally in FIG. 2, embodiments of the disclosure are not so limited. This "belt like" arrangement of the pre-formed display assembly 102 about the device housing 101 is illustrative only. In other embodiments, the pre-formed display assembly 102 can be rotated by ninety degrees so as to span the front major surface of the device housing 101, the top surface of the device housing 101, the bottom surface of the device housing 101, and the rear major surface of the device housing 101. Moreover, while the device housing 101 of FIG. 1 is substantially rectangular with a cross section 205 that is obround, embodiments of the disclosure are not so limited. The pre-formed display assembly 102 can be formed to span any number of surfaces. Thus, if the device housing 101 had a cross section 205 with four, five, six, or more surfaces, the pre-formed display assembly 102 could have its unitary pre-formed fascia's interior surfaces correspond to the exterior surfaces of the device housing 101. Thus, while one illustrative pre-formed display assembly 102 and device housing 101 configuration and/or arrangement are shown in FIG. 2 for illustrative purposes, numerous others will be obvious to those of ordinary skill in the art having the benefit of this disclosure.

Additionally, it should be noted that the electronic device 100 can be one of various types of devices. In one embodiment, the electronic device 100 is a portable electronic device, one example of which is a smartphone that will be used in the figures for illustrative purposes. However, it should be obvious to those of ordinary skill in the art having the benefit of this disclosure that the electronic device 100 could be other types of devices as well, including palm-top computers, tablet computers, gaming devices, media players, wearable devices, or other portable wireless communication devices. Still other devices will be obvious to those of ordinary skill in the art having the benefit of this disclosure.

Also illustrated in FIG. 2 is one explanatory block diagram schematic 200 of the explanatory electronic device 100. It should be understood that the block diagram schematic 200 is provided for illustrative purposes only and for illustrating components of one electronic device 100 in accordance with embodiments of the disclosure, and is not intended to be a complete block diagram schematic 200 of the various components that can be included with the electronic device 100. Therefore, other electronic devices in accordance with embodiments of the disclosure may include various other components not shown in FIG. 2, or may include a combination of two or more components or a division of a particular component into two or more separate components, and still be within the scope of the present disclosure.

In one or more embodiments, the block diagram schematic 200 is configured as a printed circuit board assembly disposed within the device housing 101 of the electronic device 100. Various components can be electrically coupled together by conductors or a bus disposed along one or more printed circuit boards.

The illustrative block diagram schematic 200 of FIG. 2 includes many different components. Embodiments of the disclosure contemplate that the number and arrangement of such components can change depending on the particular application. Accordingly, electronic devices configured in accordance with embodiments of the disclosure can include some components that are not shown in FIG. 2, and other components that are shown may not be needed and can therefore be omitted.

In one or more embodiments, the device housing 101 of the electronic device 100 defines a first major surface at side 103 and a second major surface disposed on the opposite side of the first major surface. In one or more embodiments, the first major surface and the second major surface are separated by one or more minor surfaces defined by side 104 and side 204. In one or more embodiments, a user interface 201 of the electronic device 100 includes the pre-formed display assembly 102, which wraps and envelops the first major surface, at least one minor surface, and optionally the second major surface.

The pre-formed display assembly 102 is unitary in that it provides a single display that wraps about the device housing 101 of the electronic device 100. The pre-formed display assembly 102 has a first portion that serves as a first display spanning a first major surface of the device housing 101, a second portion that wraps around the minor surface defined by side 104, and a third portion that wraps around the minor surface defined by side 104. As will be come clear in FIG. 3 below, this pre-formed display assembly 102 has a fourth portion that serves as a rear-facing display by spanning the second major surface.

In one or more embodiments, the pre-formed display assembly 102 comprises a touch sensitive display. Where so configured, information, graphical objects, user actuation targets, and other graphical indicia can be presented on any portion of the pre-formed display assembly 102, which is touch sensitive. In one or more embodiments, so as to be touch sensitive, the pre-formed display assembly 102 comprises a corresponding touch sensor 202.

In one or more embodiments, the touch sensor 202 can comprise any of a capacitive touch sensor, an infrared touch sensor, resistive touch sensors, another touch-sensitive technology, or combinations thereof. Capacitive touch-sensitive devices include a plurality of capacitive sensors, e.g., electrodes, which are disposed along a substrate. Where so configured, each capacitive sensor can be configured, in conjunction with associated control circuitry, e.g., the one or more processors 203 operable with the pre-formed display assembly 102, to detect an object in close proximity with—or touching—a surface of the pre-formed display assembly 102 by establishing electric field lines between pairs of capacitive sensors and then detecting perturbations of those field lines.

The electric field lines can be established in accordance with a periodic waveform, such as a square wave, sine wave, triangle wave, or other periodic waveform that is emitted by one sensor and detected by another. The capacitive sensors can be formed, for example, by disposing indium tin oxide patterned as electrodes on the substrate. Indium tin oxide is useful for such systems because it is transparent and conductive. Indium-tin-oxide is capable of being deposited upon the substrate in thin layers by way of a printing process. The capacitive sensors may also be deposited on the substrate by electron beam evaporation, physical vapor deposition, or other various sputter deposition techniques. As will be described below, this substrate can then be laminated to the unitary pre-formed fascia when it is loaded so as to separate at least two surfaces of the same.

In one or more embodiments, users can deliver user input to the pre-formed display assembly 102 by delivering touch input from a finger, stylus, or other objects disposed proximately with the pre-formed display assembly 102. In one embodiment, the pre-formed display assembly 102 is configured as an active matrix organic light emitting diode (AMOLED) display. However, it should be noted that other types of displays, including liquid crystal displays, are suitable for use with the user interface and would be obvious to those of ordinary skill in the art having the benefit of this disclosure.

Other features can be situated on the device housing 101 on surfaces not enveloped or covered by the pre-formed display assembly 102. For instance, a user interface component 206 such as a button or other control device can be disposed on either the top surface 207 or bottom surface 208 of the device housing 101 to facilitate additional control of the electronic device 100. Other features can be added, and can be located on top surface 207 or bottom surface 208 (or side surface if the pre-formed display assembly 102 is rotated by ninety degrees). Illustrating by example, in one or more embodiments an imager 209 or a loudspeaker 210 can be positioned on either the top surface 207 or the bottom surface 208.

In one embodiment, the electronic device includes one or more processors 203. In one embodiment, the one or more processors 203 can include an application processor and, optionally, one or more auxiliary processors. One or both of the application processor or the auxiliary processor(s) can include one or more processors. One or both of the application processor or the auxiliary processor(s) can be a microprocessor, a group of processing components, one or more ASICs, programmable logic, or other type of processing device.

The application processor and the auxiliary processor(s) can be operable with the various components of the block diagram schematic 200. Each of the application processor and the auxiliary processor(s) can be configured to process and execute executable software code to perform the various functions of the electronic device with which the block diagram schematic 200 operates. For example, in one embodiment the one or more processors 203 comprise one or more circuits operable to present content or presentation information, such as images, text, and video, on the pre-formed display assembly 102. A storage device, such as memory 211, can optionally store the executable software code used by the one or more processors 203 during operation.

In this illustrative embodiment, the block diagram schematic 200 also includes a communication circuit 212 that can be configured for wired or wireless communication with one or more other devices or networks. The networks can include a wide area network, a local area network, and/or personal area network. The communication circuit 212 may also utilize wireless technology for communication, such as, but are not limited to, peer-to-peer or ad hoc communications such as HomeRF, Bluetooth and IEEE 802.11, and other forms of wireless communication such as infrared technology. The communication circuit 212 can include wireless communication circuitry, one of a receiver, a transmitter, or transceiver, and one or more antennas.

In one embodiment, the one or more processors 203 can be responsible for performing the primary functions of the electronic device with which the block diagram schematic 200 is operational. For example, in one embodiment the one or more processors 203 comprise one or more circuits operable with the pre-formed display assembly 102 to present presentation information to a user. The executable software code used by the one or more processors 203 can be configured as one or more modules 213 that are operable with the one or more processors 203. Such modules 213 can store instructions, control algorithms, and so forth.

Other components 214 can be included with the electronic device 100. Illustrating by example, the other components 214 can include an audio input/processor. The audio input/processor can receive audio input from an environment about the electronic device 100. The audio input/processor can include hardware, executable code, and speech monitor executable code in one embodiment.

In one or more embodiments, the other components 214 can include various sensors operable with the one or more processors 203. These sensors can include a geo-locator that serves as a location detector, an orientation detector that determines an orientation and/or movement of the electronic device 100 in three-dimensional space, an imager 209, a face analyzer, an environmental analyzer, and gaze detector. The orientation detector can include an accelerometer, gyroscope(s), or other device to detect device orientation and/or motion of the electronic device 100.

The other components 214 can also include output components such as video, audio, and/or mechanical outputs. For example, the output components may include a video output component or auxiliary devices including a cathode ray tube, liquid crystal display, plasma display, incandescent light, fluorescent light, front or rear projection display, and light emitting diode indicator. Other examples of output components include audio output components such as a loudspeaker disposed behind a speaker port or other alarms and/or buzzers and/or a mechanical output component such as vibrating or motion-based mechanisms.

The other components 214 can also include proximity sensors. The proximity sensors can fall in to one of two camps: active proximity sensors that include a transmitter and receiver pair, and "passive" proximity sensors that include a receiver only. Either the proximity detector components or the proximity sensor components can be generally used for gesture control and other user interface protocols in one or more embodiments.

The other components 214 can optionally include a barometer operable to sense changes in air pressure due to elevation changes or differing pressures of the electronic device 100. The other components 214 can also optionally include a light sensor that detects changes in optical intensity, color, light, or shadow in the environment of an electronic device.

Figure 3:
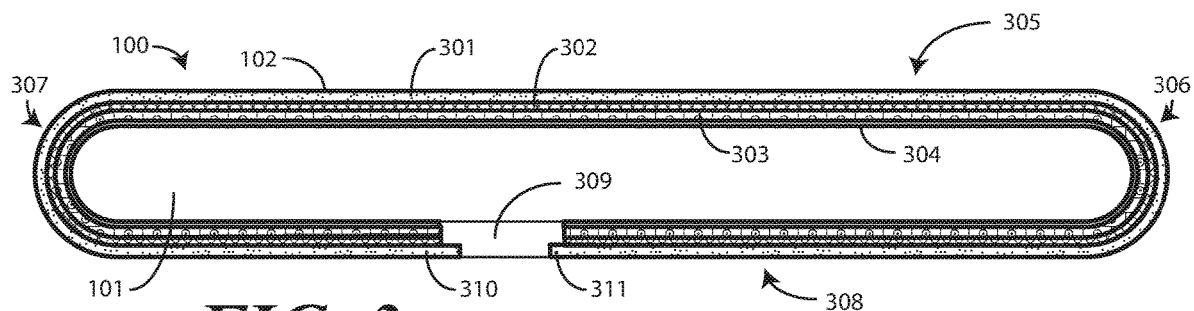
FIG. 3 illustrates one explanatory display assembly in accordance with one or more embodiments of the disclosure.

Turning now to FIG. 3, illustrated therein is a view of the electronic device 100, including the pre-formed display assembly 102, taken at cross section (205), which allows the various components of the pre-formed display assembly 102 to be seen. In one or more embodiments, the electronic device 100 includes the device housing and the pre-formed display assembly 102. As shown in FIG. 3, the pre-formed display assembly 102 wraps around at least two sides of the device housing 101. In this illustrative embodiment, the pre-formed display assembly 102 wraps not only around at least three sides of the device housing 101, but around four sides of the device housing 101.

As shown in FIG. 3, in one or more embodiments the pre-formed display assembly 102 comprises one or more layers that are coupled or laminated together to complete the pre-formed display assembly 102. In one or more embodiments, these layers comprise a unitary pre-formed fascia 301, a first adhesive layer 302, a flexible display 303, an optional second adhesive layer (not shown but would be like the first adhesive layer 302 but positioned on the interior surface of the flexible display 303), and an optional substrate 304. An optional third adhesive layer could be positioned between the optional substrate (304), where employed, or on the interior surface of the flexible display 303 to couple the pre-formed display assembly 102 to the device housing 101. Other configurations of layers suitable for manufacturing the pre-formed display assembly 102 will be obvious to those of ordinary skill in the art having the benefit of this disclosure.

Beginning from the top of the layer stack, in one or more embodiments the unitary pre-formed fascia 301 comprises an optically transparent substrate. In one or more embodiments the unitary pre-formed fascia 301 may be manufactured from an optically transparent material. This material can be any of a variety of materials. Examples include a thin film sheet of a thermoplastic material. Illustrating by example, in one embodiment the unitary pre-formed fascia 301 is manufactured from a layer of optically transparent polyamide. In another embodiment, the unitary pre-formed fascia 301 is manufactured from a layer of optically transparent polycarbonate.

In the illustrative embodiment of FIG. 3, the unitary pre-formed fascia is manufactured from glass, and comprises a unitary pre-formed glass fascia. In one or more embodiments the unitary pre-formed glass fascia is manufactured from a chemically treated glass. The unitary pre-formed glass fascia can be strengthened using an ion exchange process. In such a process, the unitary pre-formed glass fascia can be placed into a high temperature salt bath where ions are introduced into the surface of the unitary pre-formed glass fascia, thereby strengthening the same. In one or more embodiments, the unitary pre-formed glass fascia has a thickness of between 0.3 millimeters and 0.6 millimeters. For instance, in one embodiment the unitary pre-formed glass fascia has a thickness of about 0.5 millimeters. Testing and simulation has demonstrated that where the unitary pre-formed glass fascia is so configured, it can be deformed to create an open state to receive the layers coupled to the interior surfaces of the unitary pre-formed glass fascia shown in FIG. 3.

Illustrating by example, the unitary pre-formed glass fascia of FIG. 3 has an obround shape that includes a first major surface 305, a second major surface 308, and at least one arched bridging member. While the embodiments shown below in FIG. 5 includes a single arched bridging member, the unitary pre-formed glass fascia of FIG. 3 includes two arched bridging members, namely, a first arched bridging member 306 and a second arched bridging member 307. In this illustrative embodiment, both the first major surface 305 and the second major surface 308 are substantially planar. In other embodiments, the first major surface 305 and the second major surface 308 can include convex or concave contours rather than substantially planar ones. In the illustrative embodiment of FIG. 3, the first arched bridging member 306 and the second arched bridging member 307 each define a semicircular cross section. In other embodiments, the first arched bridging member 306 and the second arched bridging member 307 will have other curved contours.

In this illustrative embodiment, the first arched bridging member 306 is positioned between the first major surface 305 and the second major surface 308. Since this unitary pre-formed glass fascia includes two arched bridging members, the second arched bridging member 307 is also positioned between the first major surface 305 and the second major surface 308. Here, the first major surface 305 and the second major surface 308 physically separate the first arched bridging member 306 and the second arched bridging member 307.

In one or more embodiments, one of the first major surface 305 or the second major surface 308 defines a gap 309. In the illustrative embodiment of FIG. 3, the second major surface 308 defines the gap 309. In one or more embodiments, the gap 309 runs the length of the unitary pre-formed glass fascia, which means that the gap 309 spans the length (into the page) of the second major surface 308. If the gap 309 were positioned on the first major surface 305, it would span the length (into the page) of the first major surface 305 in one or more embodiments.

As will be described below with reference to FIGS. 4A-4D, even when the unitary pre-formed fascia 301 is manufactured from glass to define a unitary pre-formed glass fascia, where the glass is chemically strengthened testing and simulation demonstrates that the glass can be deformed to create an open state to receive the other layers and/or device housing 101. Where, for example, the unitary pre-formed glass fascia is manufactured from chemically strengthened glass having a thickness of about half a millimeter, the two edges 310,311 of the second major surface 308 defining the gap 309 can be moved outward by loading forces with the glass strain remaining under one percent by a sufficient amount that the layers coupled to the interior surface of the unitary pre-formed glass fascia can be laminated to the interior surface of the unitary pre-formed glass fascia. Additionally, the device housing 101 can be inserted into the loaded and opened unitary pre-formed glass fascia. Once the unitary pre-formed glass fascia is unloaded, it transforms to the unconstrained state shown in FIG. 3 where it wraps, spans, and/or envelops the exterior surfaces of the device housing 101. Thus, in one or more embodiments the unitary pre-formed fascia 301 comprises a unitary pre-formed glass fascia where one of the first major surface 305 or second major surface 308 is deformable to open the gap 309. This will be described in more detail below with reference to FIG. 4.

In one or more embodiments the unitary pre-formed fascia 301 functions as a fascia by defining a cover for the flexible display 303. In one or more embodiments the unitary pre-formed fascia 301 is optically transparent, in that light can pass through the unitary pre-formed fascia 301 so that objects behind the unitary pre-formed fascia 301 can be distinctly seen. The unitary pre-formed fascia 301 may optionally include a ultra-violet barrier. Such a barrier can be useful in improving the visibility of flexible display 303 in one or more embodiments.

Beneath the unitary pre-formed fascia 301 is a first adhesive layer 302, which is coupled to the interior major surface of the unitary pre-formed fascia 301. In one or more embodiments, the first adhesive layer 302 comprises an optically transparent adhesive. Said differently, in one or more embodiments the first adhesive layer 302 comprises an optically pellucid adhesive layer coupling the flexible display 303 to the interior major surface of the unitary pre-formed fascia 301.

The optically transparent adhesive can be applied to two sides of a thin, optically transparent substrate such that the first adhesive layer 302 functions as an optically transparent layer having optically transparent adhesive on both sides. Where so configured, in one or more embodiments the first adhesive layer 302 has a thickness of about fifty microns. This optically transparent version of "double-sided tape" can then be spooled and applied between the unitary pre-formed fascia 301 and the flexible display 303 to couple the two together when the unitary pre-formed fascia 301 is loaded with at least two surfaces separated such that the gap 309 is open.

In other embodiments the first adhesive layer 302 will instead be applied between the unitary pre-formed fascia 301 and the flexible display 303 as an optically transparent liquid, gel, as a homogeneous adhesive layer, or in the form of another medium when the unitary pre-formed fascia 301 is loaded with at least two surfaces separated such that the gap 309 is open. Where so configured, the first adhesive layer 302 can optionally be cured by heat, ultraviolet light, or other techniques. Other examples of materials suitable for use as the first adhesive layer 302 will be obvious to those of ordinary skill in the art having the benefit of this disclosure. In one or more embodiments, the first adhesive layer 302 mechanically couples the flexible display 303 to the interior surfaces of the unitary pre-formed fascia 301.

In one or more embodiments, the flexible display 303 is coupled to the interior major surface of the unitary pre-formed fascia 301. In the illustrative embodiment of FIG. 3, the flexible display 303 is situated between the optional substrate 304 and the unitary pre-formed fascia 301. In other embodiments, a layer above the flexible display 303 can be configured with enough stiffness to make the optional substrate 304 unnecessary. For example, in an embodiment where the unitary pre-formed fascia 301 is manufactured from chemically strengthened glass as a unitary pre-formed glass fascia, the optional substrate 304 may be omitted.

The flexible display 303 can optionally be touch-sensitive. In one or more embodiments, the flexible display 303 is configured as an organic light emitting diode (OLED) display layer coupled to the a flexible substrate, which allows the flexible display 303 to bend in accordance with various bending radii defined by the unitary pre-formed fascia 301. For example, some embodiments allow bending radii of between thirty and six hundred millimeters. Other substrates allow bending radii of around five millimeters to provide a display that is foldable through active bending. Other displays can be configured to accommodate both bends and folds.

In one or more embodiments the flexible display 303 may be formed from multiple layers of flexible material such as flexible sheets of polymer or other materials. Illustrating by example, the flexible display 303 can include a layer of optically pellucid electrical conductors, a polarizer layer, one or more optically transparent substrates, and layers of electronic control circuitry such as thin film transistors to actuate pixels and one or more capacitors for energy storage. In one or more embodiments, the flexible display 303 has a thickness of about 130 microns.

In one or more embodiments, so as to be touch sensitive, the flexible display 303 includes a layer including one or more optically transparent electrodes. In one or more embodiments, the flexible display 303 includes an organic light emitting diode layer configured to present images and other information to a user. The organic light emitting diode layer can include one or more pixel structures arranged in an array, with each pixel structure comprising a plurality of electroluminescent elements such as organic light emitting diodes. These various layers can be coupled to one or more optically transparent substrates of the flexible display 303. Other layers suitable for inclusion with the flexible display 303 will be obvious to those of ordinary skill in the art having the benefit of this disclosure.

In one or more embodiments, where the optional substrate 304 is included, the flexible display 303 can be coupled to the optional substrate 304 by a second adhesive layer, which would be like the first adhesive layer 302, although not necessarily optically transparent, and would be situated between the optional substrate 304 and the flexible display 303. In one or more embodiments, to simplify manufacture, the second adhesive layer would be identical to the first adhesive layer 302, comprising an optically transparent adhesive. However, since the second adhesive layer is coupled between the flexible display 303 and the optional substrate 304, i.e., under the flexible display 303, an optically transparent adhesive is not a requirement. The second adhesive layer could be partially optically transparent or not optically transparent at all in other embodiments.

Regardless of whether the second adhesive layer is optically transparent, in one or more embodiments the adhesive of the second adhesive layer is applied to two sides of a thin, flexible substrate. Where so configured, in one or more embodiments the second adhesive layer has a thickness of about fifty microns. This extremely thin version of "double-sided tape" can then be spooled and applied between the flexible display 303 and the optional substrate 304 to couple the two together.

In other embodiments, as with the first adhesive layer 302, the second adhesive layer will instead be applied between the flexible display 303 and the foldable substrate as a liquid, gel, as a homogeneous layer, or in the form of another medium. Where so configured, the second adhesive layer can optionally be cured by heat, ultraviolet light, or other techniques. Other examples of materials suitable for use as the second adhesive layer will be obvious to those of ordinary skill in the art having the benefit of this disclosure.

Where included, the optional substrate 304 is coupled to the flexible display 303 and defines a mechanical support for the flexible display 303 due to the fact that the optional substrate 304 is the stiffest layer of the unitary pre-formed display assembly 102 other than the unitary pre-formed fascia 301. In one or more embodiments the optional substrate 304 is manufactured from stainless steel with a thickness of about forty microns. In another embodiment, the optional substrate 304 is manufactured from a flexible plastic. Other materials from which the optional substrate 304 can be manufactured will be obvious to those of ordinary skill in the art having the benefit of this disclosure.

A third optional layer can then be positioned between the device housing 101 and the optional substrate 304, where included, or the flexible display 303. In one or more embodiments, to simplify manufacture, the third adhesive layer would be identical to the first adhesive layer 302, comprising an optically transparent adhesive. However, since the third adhesive layer is coupled between the device housing 101 and the optional substrate 304, where included, or the flexible display 303, i.e., interior of the flexible display 303, an optically transparent adhesive is not a requirement. The third adhesive layer could be partially optically transparent or not optically transparent at all in other embodiments.

In the illustrative embodiment of FIG. 3, the unitary pre-formed fascia 301 wraps around at least two sides of the device housing 101. In this embodiment, the unitary pre-formed fascia 301 wraps around four sides of the device housing 101. In other embodiments, such as that shown in FIG. 5, a unitary pre-formed glass fascia wraps around at least three sides of a device housing. Other numbers of sides that a unitary pre-formed fascia 301 or unitary pre-formed glass fascia cam wrap around a device housing will be obvious to those of ordinary skill in the art having the benefit of this disclosure.

Figure 4A:
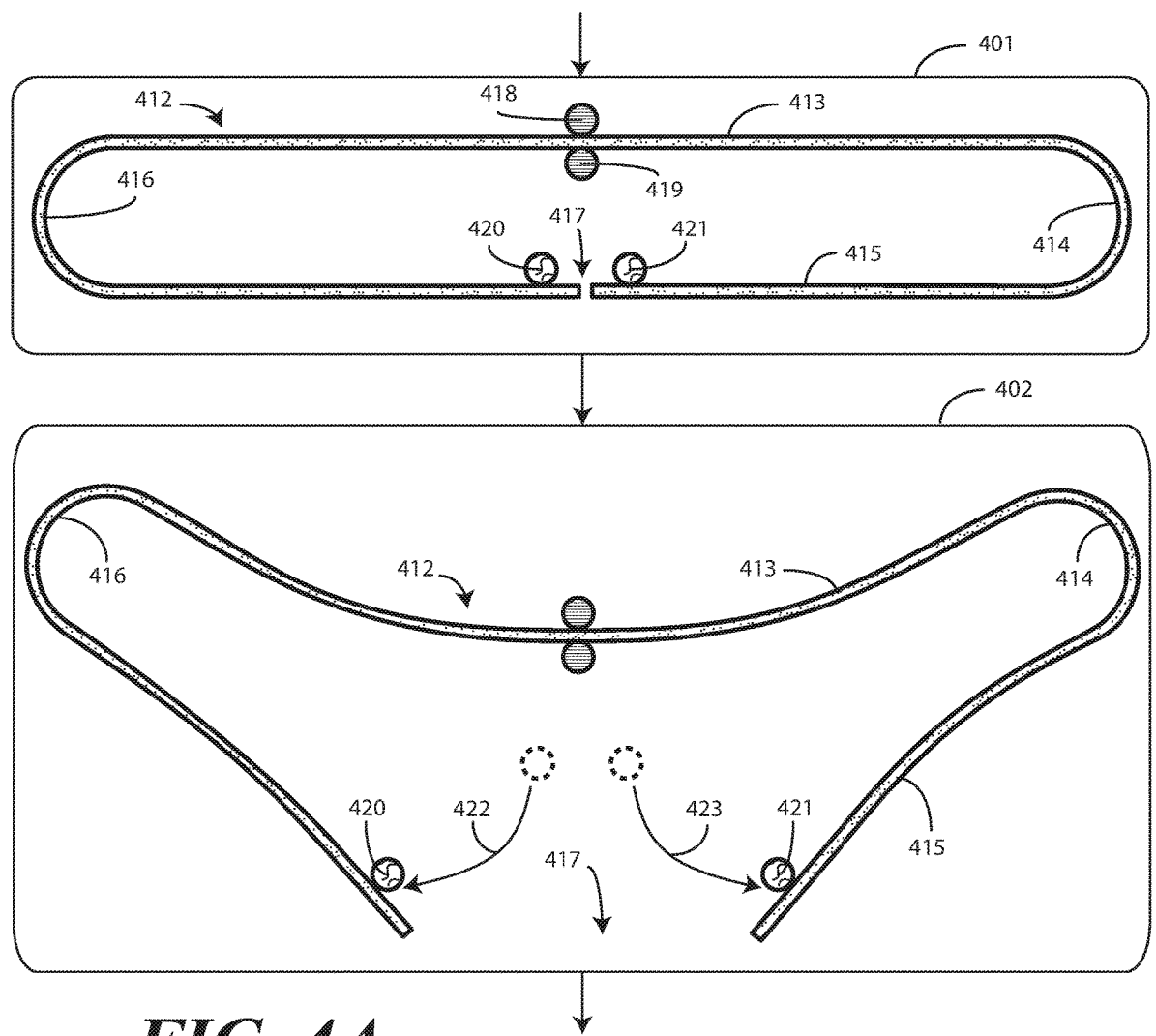
FIG. 4A illustrates one or more method steps for manufacturing one explanatory display assembly in accordance with one or more embodiments of the disclosure.

Now that various hardware components have been described, attention will be turned to methods of manufacturing the pre-formed display assembly 102 and corresponding electronic devices in accordance with one or more embodiments of the disclosure and advantages, features, and benefits provided by electronic devices configured in accordance with embodiments of the disclosure. Turning first to FIG. 4A, illustrated therein is one explanatory method for manufacturing an electronic device with a unitary glass fascia that spans at least two sides of a device housing in accordance with embodiments of the disclosure. The method of FIGS. 4A-4D illustrates one explanatory method of manufacturing an electronic device in accordance with one or more embodiments of the disclosure. Other methods will be described thereafter with reference to FIGS. 5 and 6.

Turning now to FIG. 4A, illustrated therein are one or more steps for manufacturing the electronic device (100) at FIG. 3. Beginning at step 401, a unitary pre-formed glass fascia 412 is provided. In this illustrative embodiment, the unitary pre-formed glass fascia 412 defines at least one major surface 413 configured to span a major face of a device housing and at least one curved contour defined by a first arched bridging member 414 configured to span a minor face of the device housing when the unitary glass fascia is in the unloaded state shown at step 401. In this illustrative embodiment, the unitary pre-formed glass fascia 412 comprises a first major surface 413 configured to span a major face of a device housing of an electronic device, a second major surface 415 configured to span another major face of the device housing of the electronic device, a first curved contour defined by the first arched bridging member 414 configured to span a first minor face of a device housing of the electronic device, and a second curved contour defined by a second arched bridging member 416 configured to span a second minor face of the device housing of the electronic device. As in FIG. 3, the second major surface 415 defines a gap 417 that is mechanically separable when the unitary pre-formed glass fascia 412 is in a loaded state.

As shown at step 401, the unitary pre-formed glass fascia 412 has been positioned in a loading apparatus configured to apply one or more mechanical forces to the unitary pre-formed glass fascia 412 to transition the unitary pre-formed glass fascia 412 from the unloaded or unconstrained state of step 401 to a loaded state, one example of which is shown at step 402. In the illustrative embodiment of FIG. 4, the loading apparatus includes two stationary bosses 418,419 and two translating bosses 420,421. The two stationary bosses 418,419 are centrally positioned along the first major surface 413 of the unitary pre-formed glass fascia 412 with the first major surface 413 positioned between the two stationary bosses 418,419. The two translating bosses 420, 421 are positioned with one to either side of the gap 417. The two translating bosses 420,421 are positioned against the interior surface of the second major surface 415 of the unitary pre-formed glass fascia 412.

Step 402 comprises the two translating bosses 420,421 applying a loading forces 422,423 to the interior surfaces of the second major surface 415 of the unitary pre-formed glass fascia 412 while the two stationary bosses 418,419 retain the center of the first major surface 413 in a stationary position. As shown at step 402, this transition to a loaded state causes the first curved contour defined by the first arched bridging member 414 and the second curved contour defined by the second arched bridging member 416 to expand. The loading also causes at least two surfaces, here the right and left surfaces of the second major surface 415, to separate by opening the gap 417. Said differently, at step 402 the loading of the unitary pre-formed glass fascia 412 causes the gap 417 to mechanically separate.

Figure 4B:
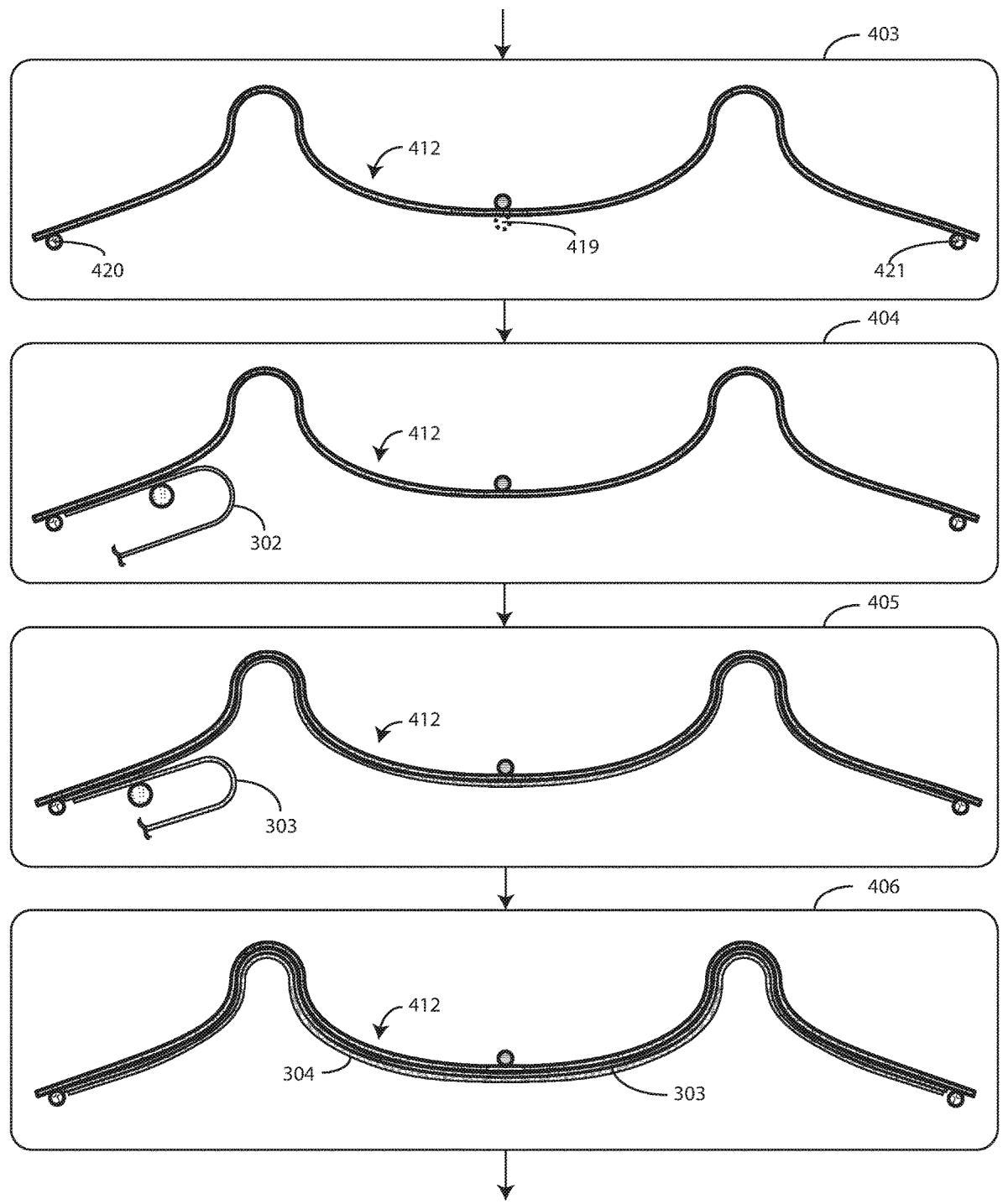
FIG. 4B illustrates one or more method steps for manufacturing one explanatory display assembly in accordance with one or more embodiments of the disclosure.

Turning now to FIG. 4B, at step 403 the two translating bosses 420,421 continue to apply the a loading forces (422,423), thereby transitioning the unitary pre-formed glass fascia 412 to the fully loaded state. Testing and simulation demonstrates that when the unitary pre-formed glass fascia 412 is manufactured from chemically strengthened glass having a thickness of between 0.4 millimeters and 0.6 millimeters, the glass is under less than a one percent strain when in the fully loaded state of step 403. This is within the limits of undamaged, chemically strengthened glass, which means the unitary pre-formed glass fascia 412 can be bent into this shape without damage or cracking.

At step 403, stationary boss 419 is removed. This removal of stationary boss 419 does not affect the loaded state of the unitary pre-formed glass fascia 412. However, it leaves the interior side of the unitary pre-formed glass fascia 412 unobstructed such that the various layers of a can be laminated to the unitary pre-formed glass fascia 412 to form a pre-formed display.

At step 404, the first adhesive layer 302 is coupled to the interior surface of the unitary pre-formed glass fascia 412 while the unitary pre-formed glass fascia 412 is in the loaded state. The first adhesive layer 302 can be applied in a variety of ways. For example, the first adhesive layer 302 can be configured as a thin, optically transparent substrate carrying an optically pellucid adhesive that is laminated to the unitary pre-formed glass fascia 412 when the unitary pre-formed glass fascia 412 is in the loaded state. Alternatively, the first adhesive layer 302 can be applied to the interior surface of the unitary pre-formed glass fascia 412 as an optically transparent liquid, gel, as a homogeneous adhesive layer, or in the form of another medium when the unitary pre-formed glass fascia 412 is in the loaded state. Thereafter, the first adhesive layer 302 can optionally be cured by heat, ultraviolet light, or other techniques.

At step 405, the flexible display 303 is coupled to the interior surface of the unitary pre-formed glass fascia 412 while the unitary pre-formed glass fascia 412 is loaded in the loaded state. In one or more embodiments, the flexible display 303 is laminated to the interior surface of the first adhesive layer 302 while the unitary pre-formed glass fascia 412 is in the loaded state. For example, the flexible display 303 may be formed from multiple layers of flexible material such as flexible sheets of polymer or other materials that can be laminated to the interior surface of the unitary pre-formed glass fascia 412 while the unitary pre-formed glass fascia 412 is in the loaded state, with the first adhesive layer 302 mechanically bonding the flexible display 303 to the interior surface of the unitary pre-formed glass fascia 412. Other techniques for coupling the flexible display 303 to the unitary pre-formed glass fascia 412 will be obvious to those of ordinary skill in the art having the benefit of this disclosure.

The remaining layers described with reference to FIG. 3 above can then be applied in the same manner. For example, as shown at step 406, the optional substrate 304 has been coupled to the interior surface of the flexible display 303 by a second adhesive layer while the unitary pre-formed glass fascia 412 is in the loaded state. A third adhesive layer has been applied to the interior surface of the optional substrate 304 while the unitary pre-formed glass fascia 412 is in the loaded state.

Figure 4C:
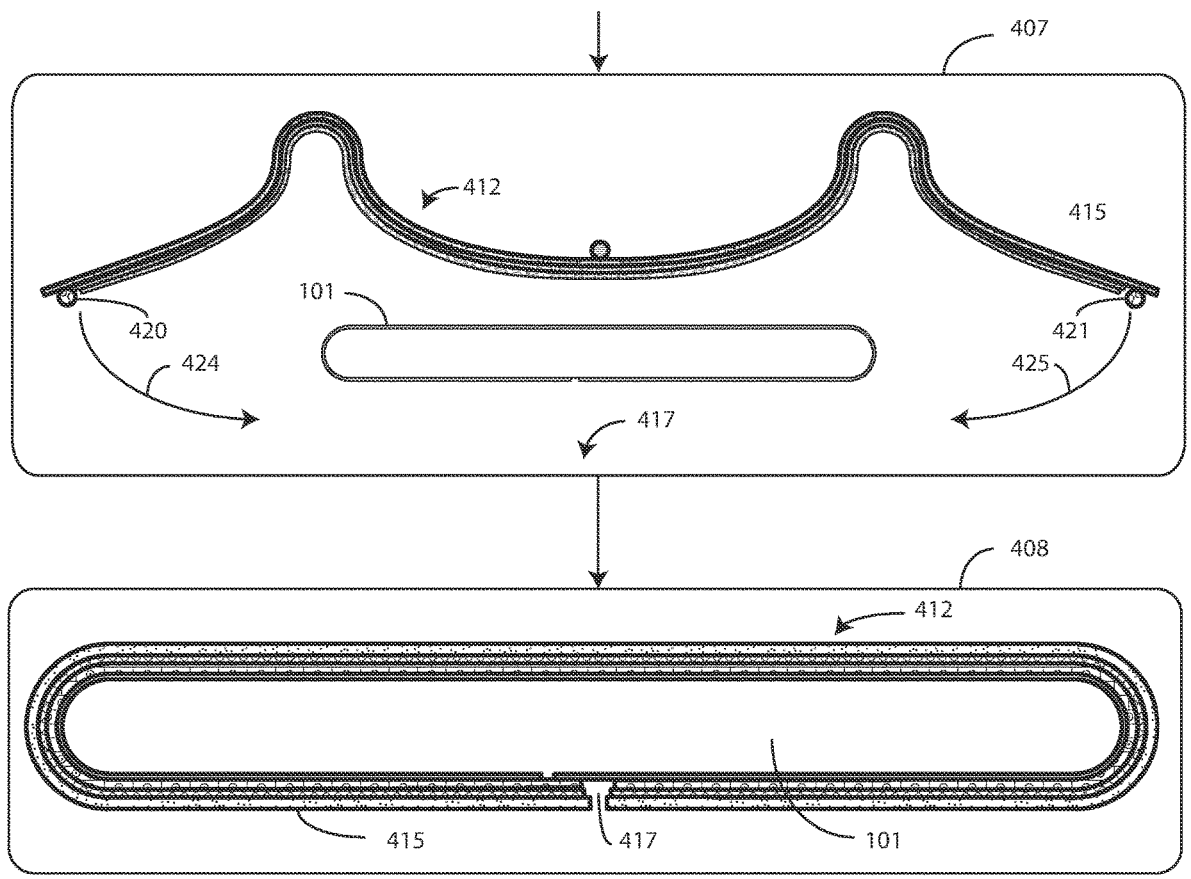
FIG. 4C illustrates one or more method steps for manufacturing one explanatory display assembly in accordance with one or more embodiments of the disclosure.

Turning now to FIG. 4C, illustrated therein are one or more method steps that can follow the method steps of FIGS. 4A and 4B. Beginning at step 407, the device body 101 has been positioned within the unitary pre-formed glass fascia 412 while the unitary pre-formed glass fascia 412 is loaded in the loaded state. Thereafter, step 407 comprises the translating bosses 420,421 unloading the unitary pre-formed glass fascia 412 to cause at least two surfaces, here the right and left surfaces of the second major surface 415 located to either side of the gap 417, to narrow. This causes the gap 417 to close, thereby causing the unitary pre-formed glass fascia 412 to span at least two sides of the device housing 101, as shown at step 408. This results in the unitary pre-formed glass fascia 412 defining a first major surface spanning a first major face of the device housing 101, a first curved contour spanning a first minor face of the device housing 101, a second major surface spanning a second major face of the device housing 101, and a second curved contour spanning a second minor face of the device housing 101. One of the first major surface or the second major surface defines the gap 417, which is the second major surface 415 in this illustration. Filler materials may then be applied to seal the gap 417 if desired.

Figure 4D:
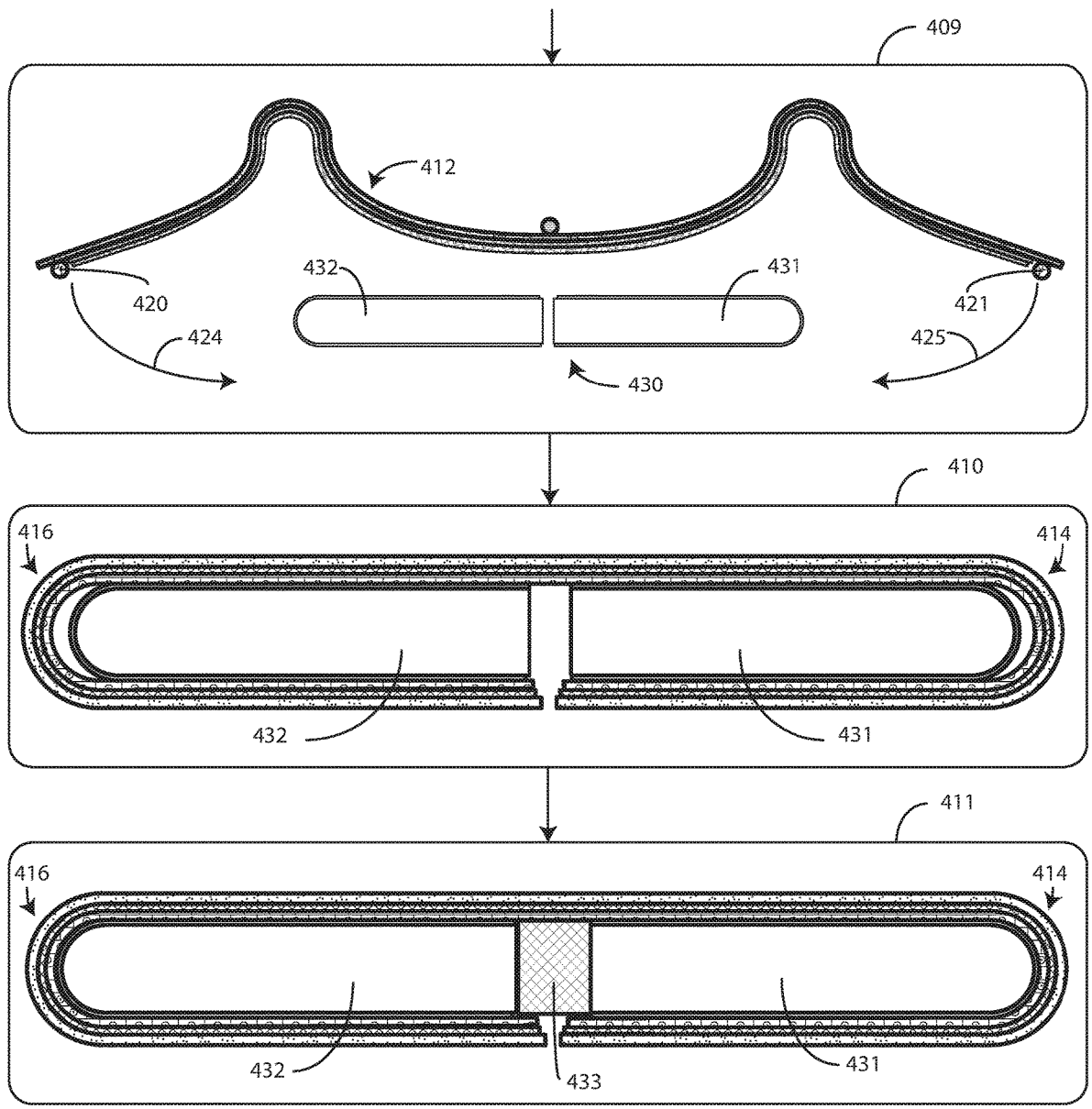
FIG. 4D illustrates one or more method steps for manufacturing one explanatory display assembly in accordance with one or more embodiments of the disclosure.

Turning now to FIG. 4D, illustrated therein are one or more alternate method steps that can follow the method steps of FIGS. 4A and 4B. Beginning at step 409, the device body 430 has been positioned within the unitary pre-formed glass fascia 412 while the unitary pre-formed glass fascia 412 is loaded in the loaded state. In this illustrative embodiment, the device housing 430 comprises a first device housing portion 431 and a second device housing portion 432.

At step 409, the translating bosses 420,421 again unload 424,425 the unitary pre-formed glass fascia 412 to cause at least two surfaces, here the right and left surfaces of the second major surface 415 located to either side of the gap 417, to narrow. This causes the gap 417 to close, thereby causing the unitary pre-formed glass fascia 412 to span at least two sides of the first device housing portion 431 and the second device housing portion 432, as shown at step 410.

To situate the first device housing portion 431 into the first arched bridging member 414 of the unitary pre-formed glass fascia 412, and the second device housing portion 432 into the second arched bridging member 416, respectively, the first device housing portion 431 and the second device housing portion 432 are physically separated from each other, thereby translating them into the first arched bridging member 414 and the second arched bridging member 416, respectively. At step 411, a separation mechanism 433 biases the first device housing portion 431 toward the first arched bridging member 414 and the second device housing portion 432 toward the second arched bridging member 416.

This results in the unitary pre-formed glass fascia 412 defining a first major surface spanning a first major face of the first device housing portion 431 and a first major face of the second device housing portion 432, a first curved contour spanning a first minor face of the first device housing portion 431, a second major surface spanning a second major face of face of the first device housing portion 431 and a second major face of the second device housing portion 432, and a second curved contour spanning a second minor face of the second device housing portion 432, as shown at step 411.

Figure 5:
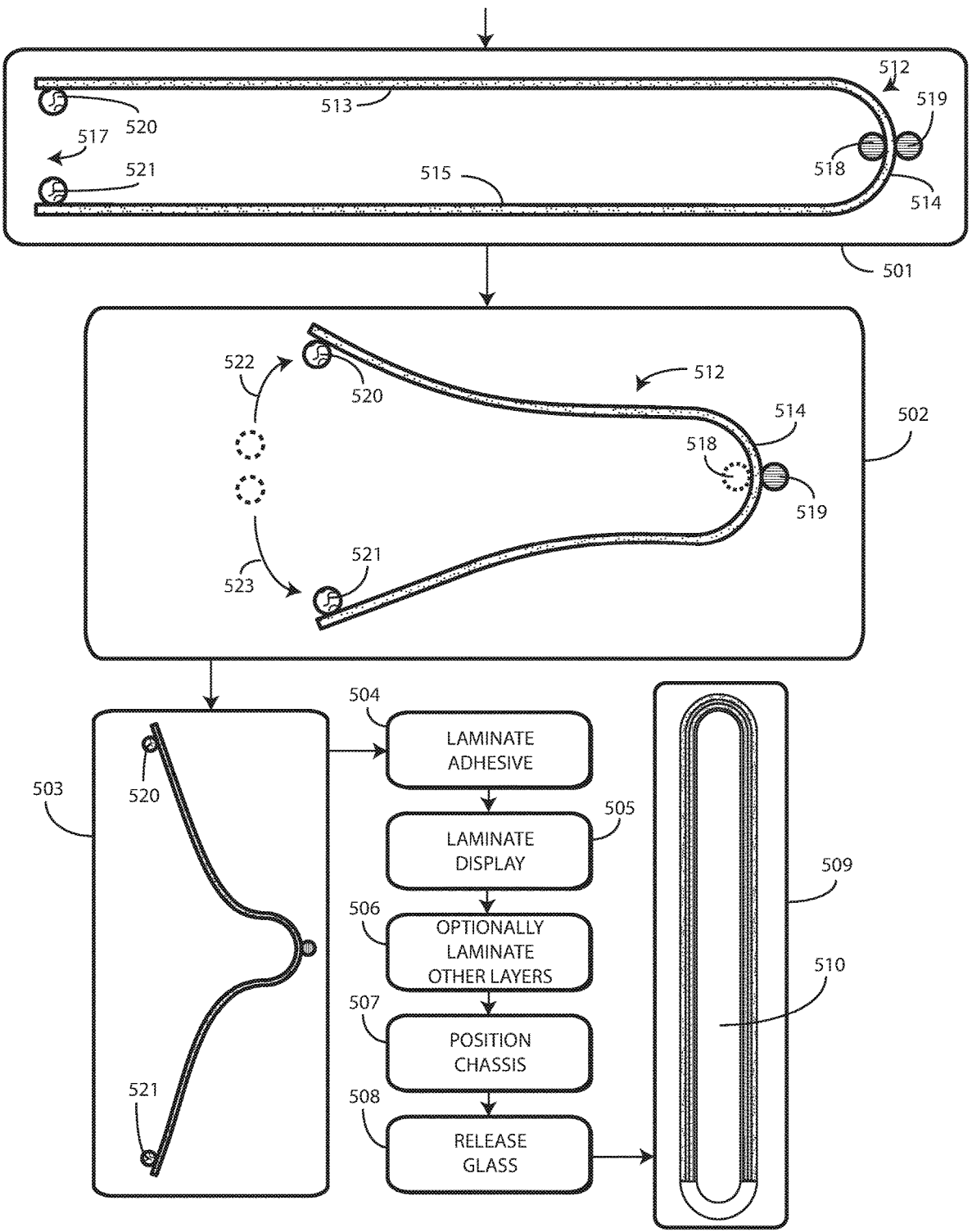
FIG. 5 illustrates one or more method steps for manufacturing another explanatory display assembly in accordance with one or more embodiments of the disclosure.

Turning now to FIG. 5, illustrated therein are one or more steps for manufacturing another electronic device configured in accordance with one or more embodiments of the disclosure. Beginning at step 501, a unitary pre-formed glass fascia 512 is provided. It should be noted that while a unitary pre-formed glass fascia 512 is provided at step 501 in this illustrative embodiment, in another embodiment the pre-formed glass fascia could be segmented. For example, the unitary pre-formed glass fascia 512 of step 512 could define half of an overall fascia designed to envelop or wrap around a right (or top) side of an electronic device, while another unitary pre-formed glass fascia configured as the mirror image of unitary pre-formed glass fascia 512 could be configured to envelope or wrap around the left (or bottom) side of the electronic device, with the two unitary pre-formed glass fasciae being bonded in a different region. Such an alternate embodiment may be useful to prevent the first major surface 512 and second major surface 515 from becoming too long.

In this illustrative embodiment, the unitary pre-formed glass fascia 512 is U-shaped. Said differently, the unitary pre-formed glass fascia 512 defines at least one major surface 513 configured to span a major face of a device housing and only one curved contour (first arched bridging member 514) configured to span a minor face of the device housing when the unitary glass fascia is in the unloaded state shown at step 501. In this illustrative embodiment, the unitary pre-formed glass fascia 512 comprises a second major surface 515 configured to span another major face of the device housing of the electronic device. In this illustrative embodiment, the first major surface 513 and the second major surface 515 define a gap 517 situated opposite the first major surface 513 and the second major surface 515 from the first arched bridging member 514. The first major surface 513 and the second major surface 515 are mechanically separable when the unitary pre-formed glass fascia 512 is in a loaded state to open the gap 517.

As shown at step 501, the unitary pre-formed glass fascia 512 has been positioned in a loading apparatus configured to apply one or more mechanical forces to the unitary preformed glass fascia 512 to transition the unitary pre-formed glass fascia 512 from the unloaded or unconstrained state of step 501 to a loaded state, one example of which is shown at step 502. In the illustrative embodiment of FIG. 5, the loading apparatus includes two stationary bosses 518,519 and two translating bosses 520,521. The two stationary bosses 518,519 are centrally positioned along the arched bridging member 514 of the unitary pre-formed glass fascia 512 with the arched bridging member 514 positioned between the two stationary bosses 518,519. The two translating bosses 520,521 are positioned at the end of the extensions of the U-shape, with one to either side of the gap 517. The two translating bosses 520,521 are positioned against the interior surface of the first major surface 513 and the second major surface 515 of the unitary pre-formed glass fascia 512.

Step 502 comprises the two translating bosses 520,521 applying a loading forces 522,523 to the interior surfaces of the first major surface 513 second major surface 515 of the unitary pre-formed glass fascia 512, respectively, while the two stationary bosses 518,519 retain the center of the arched bridging member 514 in a stationary position. As shown at step 502, this transition to a loaded state causes the arched bridging member 514 to expand. The loading also causes at least two surfaces, here the first major surface 513 and second major surface 515, to deform, thereby opening the gap 517. Said differently, at step 502 the loading of the unitary pre-formed glass fascia 512 causes the gap 517 to mechanically separate. At step 502, stationary boss 518 can be removed so that the layers of the display can be laminated to the interior surface of the unitary pre-formed glass fascia 512.

At step 503, the two translating bosses 520,521 continue to apply the loading forces (522,523), thereby transitioning the unitary pre-formed glass fascia 512 to the fully loaded state. At step 504, the first adhesive layer is coupled to the interior surface of the unitary pre-formed glass fascia 512 while the unitary pre-formed glass fascia 512 is in the loaded state.

At step 505, the flexible display is coupled to the interior surface of the unitary pre-formed glass fascia 512 while the unitary pre-formed glass fascia 512 is loaded in the loaded state. The remaining layers described with reference to FIG. 3 above can then be applied at step 506 as previously described.

At step 507, a device body is positioned within the unitary pre-formed glass fascia 512 while the unitary pre-formed glass fascia 512 is loaded in the loaded state. At step 508, the translating bosses 520,521 unload the unitary pre-formed glass fascia 512 to cause at least two surfaces, here the first major surface 513 and the second major surface 515, to narrow. This causes the gap 517 to close, thereby causing the unitary pre-formed glass fascia 512 to span at least three sides of the device housing 510, as shown at step 509. This results in the unitary pre-formed glass fascia 512 defining a first major surface spanning a first major face of the device housing 510, a first curved contour (arched bridging member 514) spanning a first minor face of the device housing 510, and a second major surface spanning a second major face of the device housing 510. Filler materials may then be applied to seal the gap 517 if desired.

Figure 6:
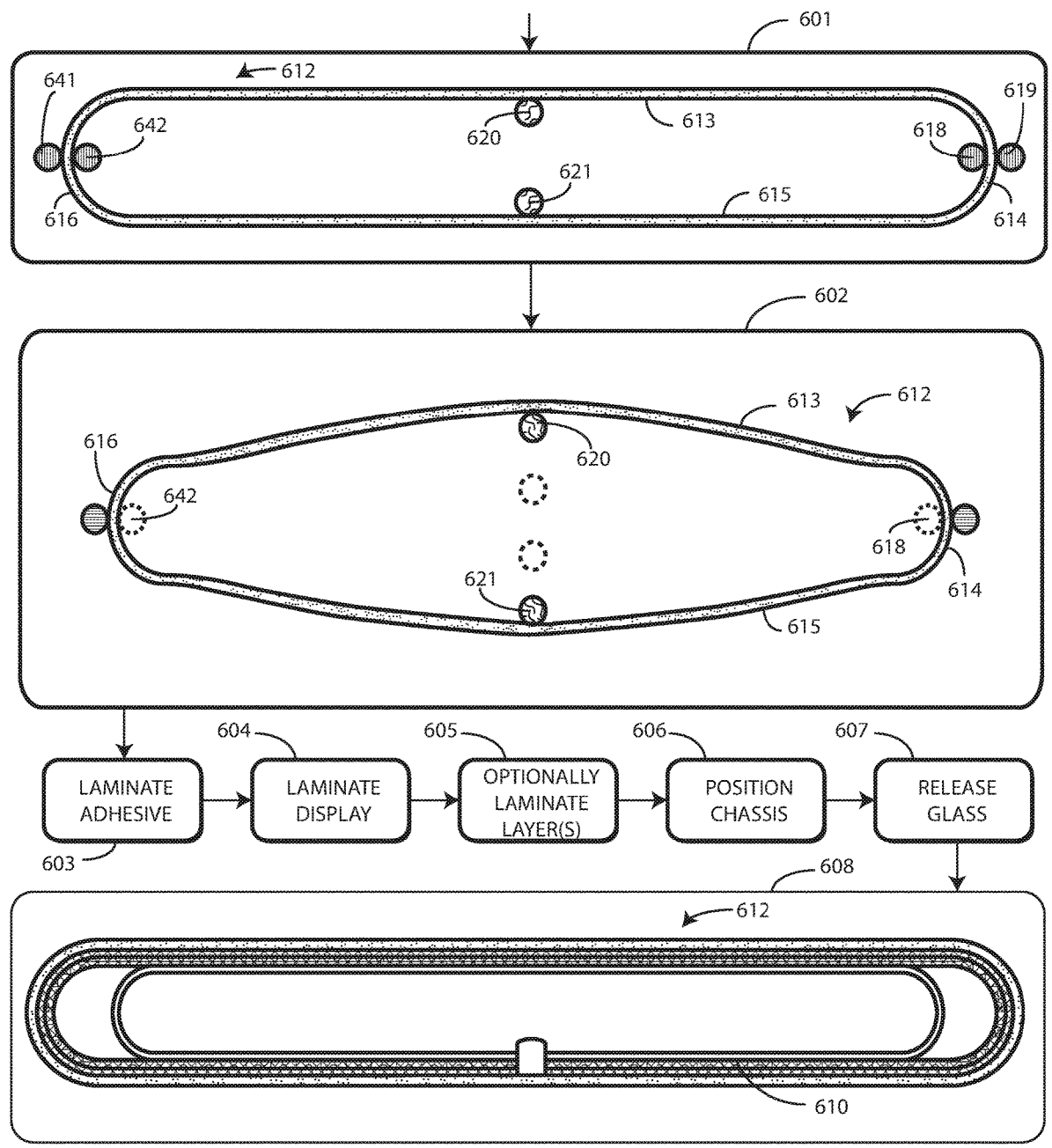
FIG. 6 illustrates one or more method steps for manufacturing still another explanatory display assembly in accordance with one or more embodiments of the disclosure.

Turning now to FIG. 6, illustrated therein are one or more steps for manufacturing yet another electronic device configured in accordance with one or more embodiments of the disclosure. Beginning at step 601, a unitary pre-formed glass fascia 612 is provided. In this illustrative embodiment, the unitary pre-formed glass fascia 612 is obround. Said differently, the unitary pre-formed glass fascia 612 defines at least one major surface 613 configured to span a major face of a device housing, a first arched bridging member 614 configured to span a first minor face of the device housing, a second major surface 615 configured to span a second major surface of the device housing, and a second arched bridging member 616 configured to span a second minor surface of the device housing when the unitary pre-formed glass fascia 612 is in the unloaded state shown at step 601. Since the unitary pre-formed glass fascia 612 is obround, there is no gap in this embodiment, which is in contrast to the embodiments of FIGS. 3-5 described above.

As shown at step 601, the unitary pre-formed glass fascia 612 has been positioned in a loading apparatus configured to apply one or more mechanical forces to the unitary pre-formed glass fascia 612 to transition the unitary pre-formed glass fascia 612 from the unloaded or unconstrained state of step 601 to a loaded state, one example of which is shown at step 602. In the illustrative embodiment of FIG. 6, the loading apparatus includes six translating bosses 618,619, 641,642,620,621. Four translating bosses 618,619,641,642 are centrally positioned along the first arched bridging member 614 and the second arched bridging member 616, respectively, with the first arched bridging member 614 positioned between two translating bosses 618,619 and the second arched bridging member 616 positioned between the other two translating bosses 641,642. The other two translating bosses 620,621 are centrally positioned along the first major surface 613 and second major surface 615, respectively. The two translating bosses 620,621 are positioned against the interior surface of the first major surface 613 and the second major surface 615 of the unitary pre-formed glass fascia 612.

Step 602 comprises the two translating bosses 620,621 applying a loading forces to the interior surfaces of the first major surface 613 and second major surface 615 of the unitary pre-formed glass fascia 612, respectively, while the other four translating bosses 618,619,641,642 retain the first arched bridging member 614 and the second arched bridging member 616 in a vertically stationary position while translating inward horizontally. These four translating bosses 618,619,641,642 translate inward slightly to allow the unitary pre-formed glass fascia 612 to expand to the shape shown at step 602. At this point, translating bosses 642,618 can be removed to allow the display and other layers to be laminated to the interior surfaces of the unitary pre-formed glass fascia 612. As shown at step 602, this transition to a loaded state causes the first arched bridging member 614 and the second arched bridging member 616 to expand. The loading also causes at least two surfaces, here the first major surface 613 and second major surface 615, to deform, thereby opening the obround shape of the unitary pre-formed glass fascia 612.

At step 603, the first adhesive layer is coupled to the interior surface of the unitary pre-formed glass fascia 612 while the unitary pre-formed glass fascia 612 is in the loaded state. At step 604, the flexible display is coupled to the interior surface of the unitary pre-formed glass fascia 612 while the unitary pre-formed glass fascia 612 is loaded in the loaded state. The remaining layers described with reference to FIG. 3 above can then be applied at step 605 as previously described.

At step 606, a device body is positioned within the unitary pre-formed glass fascia 612 while the unitary pre-formed glass fascia 612 is loaded in the loaded state. At step 607, the translating bosses 620,621 unload the unitary pre-formed glass fascia 612 to cause at least two surfaces, here the first major surface 613 and the second major surface 615, to narrow. This causes the unitary pre-formed glass fascia 612 to completely encircle and envelop at least four sides of the device housing 610, as shown at step 608.

Figure 7:
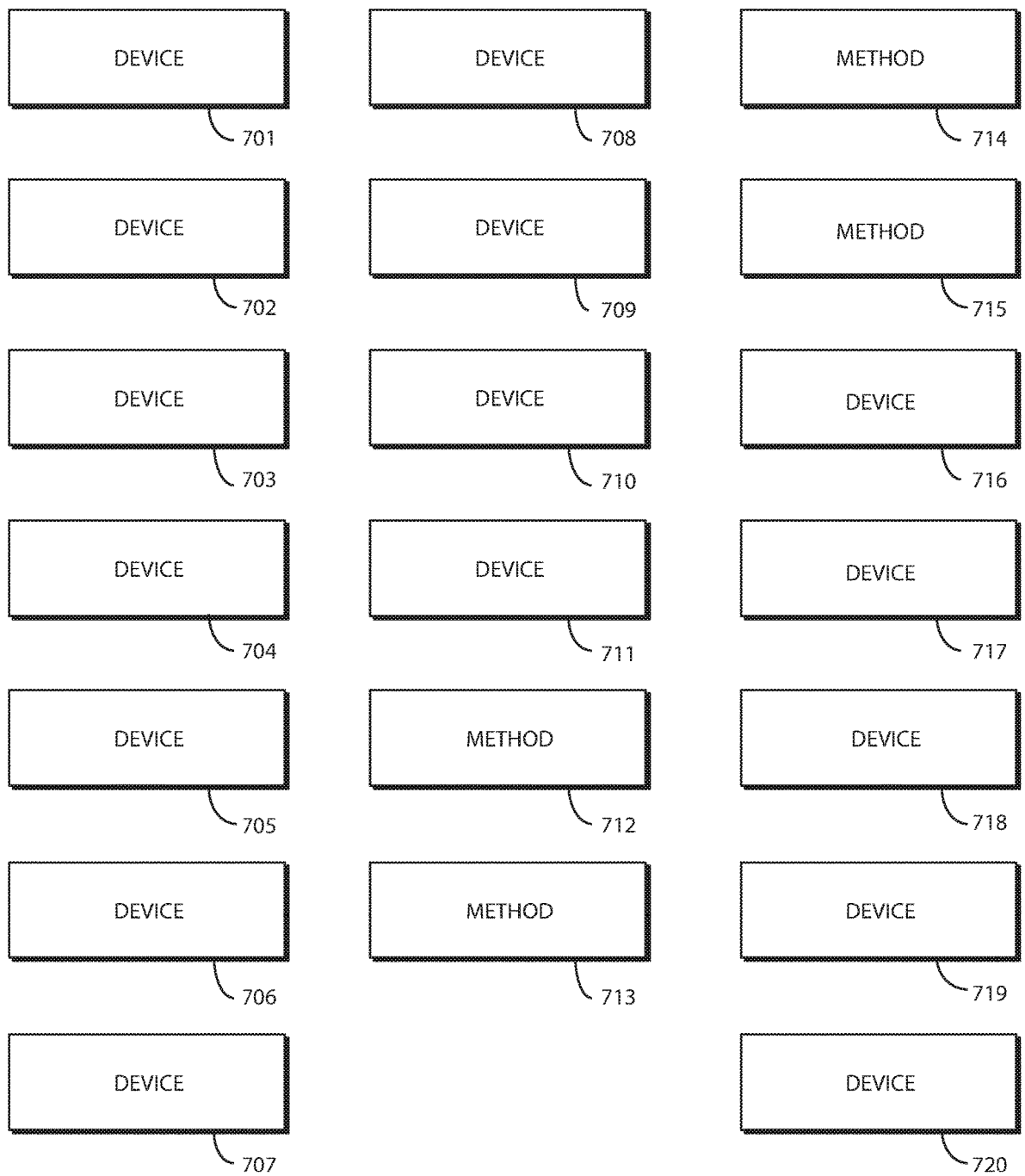
FIG. 7 illustrates one or more embodiments of the disclosure.

Turning now to FIG. 7, illustrated therein are various embodiments of the disclosure. The embodiments of FIG. 7 are shown as labeled boxes in FIG. 7 due to the fact that the individual components of these embodiments have been illustrated in detail in FIGS. 1-6, which precede FIG. 6. Accordingly, since these items have previously been illustrated and described, their repeated illustration is no longer essential for a proper understanding of these embodiments. Thus, the embodiments are shown as labeled boxes.

At 701, an electronic device comprises a device housing and a unitary pre-formed fascia coupled to, and wrapping around at least two sides of, the device housing.

At 702, the electronic device of 701 further comprises a flexible display coupled to an interior major surface of the unitary pre-formed fascia. At 703, the electronic device of 702 further comprises an optically pellucid adhesive layer coupling the flexible display to the interior major surface of the unitary pre-formed fascia.

At 704, the unitary pre-formed fascia of 702 wraps around at least three sides of the device housing. At 705, the unitary pre-formed fascia of 704 defines at least a first major surface, a second major surface, and a first arched bridging member positioned between the first major surface and the second major surface.

At 706, the unitary pre-formed fascia of 705 further defines a second arched bridging member positioned between the first major surface and the second major surface with the first major surface and the second major surface separating the first arched bridging member and the second arched bridging member. At 707, one or both of the first arched bridging member or the second arched bridging member of 706 defines a semicircular cross section.

At 708, one or both of the first major surface or the second major surface of 706 is substantially planar. At 709, the one of the first major surface or the second major surface of 706 defines a gap spanning a length of the one of the first major surface or the second major surface.

At 710, the unitary pre-formed fascia of 709 comprises a unitary pre-formed glass fascia with one of the first major surface or the second major surface is deformable to open the gap. At 711, the device housing of 709 comprises a first device housing portion and a second device housing portion. At 711, the electronic device of 709 further comprises a separation mechanism biasing the first device housing portion toward the first arched bridging member and the second device housing portion toward the second arched bridging member.

At 712, a method of manufacturing an electronic device comprises loading a unitary glass fascia to cause at least two surfaces of the unitary glass fascia to separate. At 712, the method comprises positioning a device housing within the unitary glass fascia while the unitary glass fascia is loaded. At 712, the method comprises unloading the unitary glass fascia to cause the at least two surfaces of the unitary glass fascia to narrow, thereby causing the unitary glass fascia to span at least two sides of the device housing.

At 713, the method of 712 further comprises coupling a flexible display to an interior surface of the unitary glass fascia while the unitary glass fascia is loaded and prior to positioning the device housing within the unitary glass fascia. At 714, the unitary glass fascia of 712 defines a gap. At 714, the loading of the unitary glass fascia causes the gap to mechanically separate.

At 715, the unitary glass fascia of 712 defines at least one curved contour separating a first major surface and a second major surface of the unitary glass fascia. At 715, the loading of the unitary glass fascia causes the at least one curved contour to open.

At 716, an electronic device comprises a device housing and a unitary glass fascia defining at least one major surface spanning a major face of the device housing and at least one curved contour spanning a minor face of the device housing when the unitary glass fascia is in an unloaded state.

At 717, the electronic device of 716 further comprises a flexible display coupled to an interior of the at least one major surface and the at least one curved contour. At 718, the unitary glass fascia of 717 defines a gap that is mechanically separable when the unitary glass fascia is in a loaded state. At 719, the loaded state of 718 causes the at least one curved contour to expand.

At 720, the unitary glass fascia of 718 defines a first major surface spanning a first major surface of the device housing and a first curved contour spanning a first minor face of the device housing. At 720, the unitary glass fascia of 718 defines a second major surface spanning a second major surface of the device housing and a second curved contour spanning a second minor face of the device housing. At 720, one of the first major surface or the second major surface defines the gap of 718.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronic device, comprising:
a device housing; and
a unitary pre-formed fascia coupled to, and wrapping around at least four sides of, the device housing;
wherein:
the unitary pre-formed fascia defines an obround shape in cross section having a first major surface that is substantially planar, a second major surface that is substantially planar and that defines a gap defining a discontinuity in, and spanning a length of, the second major surface, a first arched bridging member positioned between the first major surface and a right surface of the second major surface situated to a right side of the gap, and a second arched bridging member positioned between the first major surface and a left surface of the second major surface situated to a left side of the gap, with the first major surface and the second major surface physically separating the first arched bridging member and the second arched bridging member; and the unitary pre-formed fascia comprises a unitary pre-formed glass fascia with the second major surface being deformable to open the gap.

2. The electronic device of claim 1, further comprising a flexible display coupled to an interior major surface of the unitary pre-formed fascia.

3. The electronic device of claim 2, further comprising an optically pellucid adhesive layer coupling the flexible display to the interior major surface of the unitary pre-formed fascia, the optically pellucid adhesive layer comprising optically transparent adhesive applied to two sides of an optically transparent substrate that is spooled and applied between the unitary pre-formed fascia and the flexible display when the unitary pre-formed fascia is loaded to open the gap situated between the right surface of the second major surface and the left surface of the second major surface.

4. The electronic device of claim 2, the unitary pre-formed fascia manufactured from chemically strengthened glass having a thickness of between 0.3 and 0.6 millimeters, inclusive, such that a separation of the gap sufficient for the flexible display to be coupled to the interior major surface of the unitary pre-formed fascia remains under one percent.

5. The electronic device of claim 4, further comprising a substrate defining a mechanical support for the flexible display, wherein the flexible display is positioned between the substrate and the interior major surface of the unitary pre-formed fascia.

6. The electronic device of claim 1, the obround shape having a first dimension along an axis oriented normally with apices of the first arched bridging member and the second arched bridging member in cross section that is at least ten times greater than a second dimension along another axis oriented normally with the first major surface and the second major surface in cross section.

7. The electronic device of claim 1, further comprising filler materials sealing the gap positioned between the right surface of the second major surface and the left surface of the second major surface.

8. The electronic device of claim 1, wherein one or both of the first major surface or the second major surface are configured to deform from being substantially planar geometry when the unitary pre-formed fascia is loaded to open the gap situated between the right surface of the second major surface and the left surface of the second major surface.

9. The electronic device of claim 1, wherein an edge of the right surface of the second major surface and another edge of the left surface of the second major surface defines the gap.

10. The electronic device of claim 1, wherein the first arched bridging member and the second arched bridging member each define semicircular cross sections configured to open when the unitary pre-formed fascia is loaded to open the gap situated between the right surface of the second major surface and the left surface of the second major surface.

11. The electronic device of claim 1, wherein the device housing comprises a first device housing portion and a second device housing portion, further comprising a separation mechanism biasing the first device housing portion toward the first arched bridging member and the second device housing portion toward the second arched bridging member.

12. A method of manufacturing an electronic device, the method comprising:
loading a unitary glass fascia to cause at least two major surfaces to deform from a substantially planar geometry, with one major surface of the two major surfaces having a right surface and a left surface that separate;
positioning a device housing within the unitary glass fascia while the unitary glass fascia is loaded and the at least two major surfaces are deformed from the substantially planar geometry;
and unloading the unitary glass fascia to cause the at least two major surfaces of the unitary glass fascia to return to the substantially planar geometry with a gap defined between edges of the right surface of the one major surface of the at least two major surfaces and the left surface of the one major surface of the at least two major surfaces narrowing, thereby causing the at least two major surfaces of the unitary glass fascia to span at least two sides of the device housing.

13. The method of claim 12, further comprising coupling a flexible display to an interior surface of the unitary glass fascia while the unitary glass fascia is loaded and prior to positioning the device housing within the unitary glass fascia.

14. The method of claim 12, further comprising centrally positioning a first stationary boss and a second stationary boss against an interior of a first major surface of the at least two major surfaces and an exterior of the first major surface of the at least two major surfaces, respectively, and positioning a first translating boss against an interior of a second major surface of the at least two major surfaces to one side of the gap and a second translating boss against the interior of the second major surface of the at least two major surfaces to another side of the gap, and translating the first translating boss and the second translating boss to apply loading forces to the second major surface to cause the gap to mechanically separate.

15. The method of claim 12, the unitary glass fascia defining at least one curved contour separating a first major surface and a second major surface of the unitary glass fascia, wherein the loading of the unitary glass fascia causes the at least one curved contour to open.

16. An electronic device, comprising:
a device housing; and
a unitary glass fascia defining an oblong cross section having two substantially planar major surfaces spanning two major faces of the device housing and two curved contours positioned between, and physically separated by, the two substantially planar major surfaces and spanning two curved minor faces of the device housing when the unitary glass fascia is in an unloaded state;
the unitary glass fascia defining a gap separating only one of the two substantially planar major surfaces along its entire length such that the gap is mechanically separable so as to deform both substantially planar major surfaces from their substantially planar geometry when the unitary glass fascia is in a loaded state.

17. The electronic device of claim 16, further comprising a flexible display laminated to an interior of the unitary glass fascia along the two substantially planar major surfaces and the two curved contours.

18. The electronic device of claim 17, the gap situated between two edges of the only one of the two substantially planar major surfaces, with the two edges spanning a length of another major face of the device housing.

19. The electronic device of claim 17, the loaded state causing the at least the two curved contours to expand when the substantially planar major surfaces deform from their substantially planar geometry.

20. The electronic device of claim 17, the flexible display defining a waterfall display presenting imagery spanning a major face of the device housing and the two curved minor faces of the device housing.

\* \* \* \* \*